United States Patent [19]
Prins

[11] Patent Number: 5,385,762
[45] Date of Patent: Jan. 31, 1995

[54] DIAMOND DOPING

[76] Inventor: Johan F. Prins, 8 Portland Place, Northcliff Extension 13, Johannesburg, Transvaal, South Africa

[21] Appl. No.: 73,458

[22] Filed: Jun. 7, 1993

[30] Foreign Application Priority Data

Jun. 5, 1992 [ZA] South Africa .................. 92/4113

[51] Int. Cl.⁶ .............................................. B05D 3/06
[52] U.S. Cl. .................................. 427/526; 427/140; 427/530; 427/533
[58] Field of Search ................ 427/526, 530, 533, 140

[56] References Cited

U.S. PATENT DOCUMENTS 4,976,987 12/1990 Musket et al. ...................... 427/528

OTHER PUBLICATIONS

Prins, Johan F., "Activation of boron-dopant atoms in ion-implanted diamonds", Physical Review B, vol. 38, No. 8, 15 Sep. 1988-I, pp. 5576–5584.

*Primary Examiner*—Bernard Pianalto
*Attorney, Agent, or Firm*—Arnold, White & Durkee

[57] ABSTRACT

A method of producing a doped diamond, typically a boron doped diamond, is provided. The method involves multiple cold implantation/rapid annealing steps. A doped diamond can be produced containing a high concentration of dopant atoms.

13 Claims, 2 Drawing Sheets

DIAMOND DOPING

BACKGROUND OF THE INVENTION

This invention relates to diamond doping.

The doping of diamond with atoms such as boron, nitrogen, phosphorus, arsenic and the like is known. One such method which has been described in the literature is to create a damaged layer within the diamond by ion bombardment at low temperature, i.e. that of liquid nitrogen, introduce dopant atoms into the damaged layer at the same or a similar low temperature, and then anneal the damaged layer to cause dopant interstitial atoms to diffuse to lattice positions and to reduce the lattice damage. The annealing may be rapid annealing.

SUMMARY OF THE INVENTION

According to the present invention, a method of producing a doped diamond includes the steps of:

(i) creating a damaged layer of point defects in the form of vacancies and interstitial atoms within the crystal lattice of a diamond using low dose ion implantation at low temperature;

(ii) introducing dopant atoms into the damaged layer using low dose ion implantation at low temperature:

(iii) rapidly annealing the product of step (ii) to reduce lattice damage and to cause dopant interstitial atoms to diffuse into lattice positions: and (iv) repeating steps (i) to (iii) until a doped diamond having a desired amount of dopant is produced.

DESCRIPTION OF EMBODIMENTS

Figure 1:
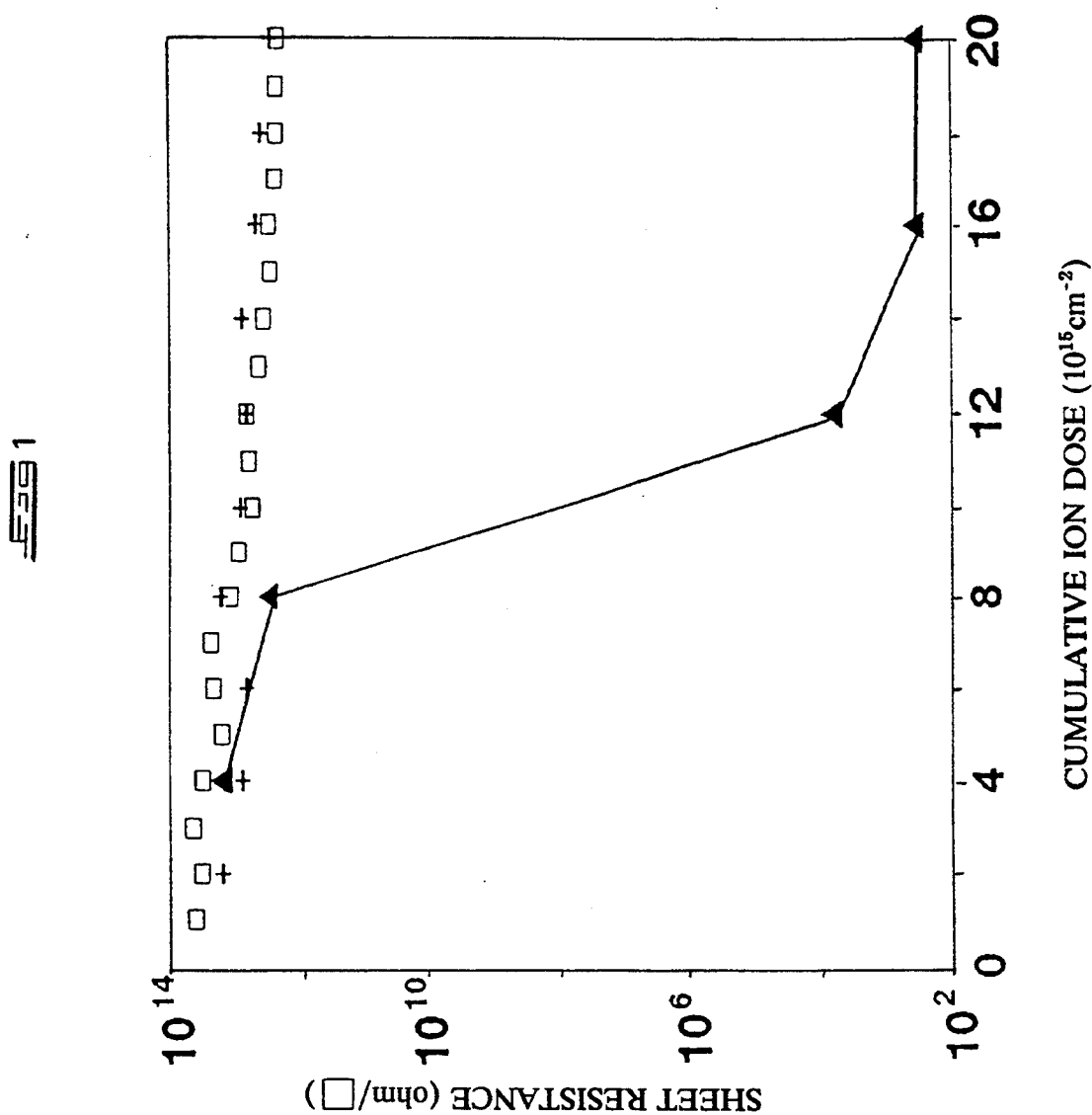
FIGS. 1 and 2 are graphs illustrating aspects of the invention.

The method of the invention involves multiple cold implantation/rapid annealing steps to introduce dopant atoms into a diamond. Generally steps (i) to (iii) will be repeated several times and at least five or more times. The extent to which the steps are repeated will depend on the degree of doping required. It has been found that high concentrations of dopant atoms can be introduced into diamond using this method and concentrations which are higher than those attainable using prior art methods. By way of example, boron concentrations higher than the boron concentration of naturally occurring type IIb diamond are possible.

The damaged layer in the diamond is achieved using low dose ion implantation at low temperature. Ion implantation involves bombarding the diamond with ions of a suitable energy. The dose will be such that at the temperature selected, point defects in the form of vacancies and interstitials will be produced in the layer, but amorphisation will not occur. The fundamental crystal structure of the diamond will remain in the damaged layer.

The temperature at which the damage-creating ion implantation will occur will be low and generally sufficiently low to ensure the point defects are frozen in place and do not diffuse. The temperature will be below 0° C. and generally substantially below 0° C. Typical temperatures which can be used are those of the order of liquid nitrogen or lower.

Similar conditions are used for the low dose ion implantation at low temperature used in step (ii).

Steps (i) and (ii) can be carried out simultaneously. For example, the damage can be created with the same ion which is used to dope the diamond. For example, if boron ions are implanted into the diamond, the ion implantation may use only boron ions, preferably at different energies. The boron ions will not only create the damaged layer in the diamond but also provide the dopant atoms for this layer.

The dose for the ion implantation will vary according to the nature and energy of the ions used. The higher the energy and the higher the atomic mass of the ion, the lower, in general, will be the dose.

Sufficient damage must be caused to create point defects and interstitials, but the damage must not be such as to cause amorphisation of the damaged layer. Examples of suitable doses are:

Carbon—Carbon ions may be used to create the damaged layer in step (i). The energy of the carbon ions can range from keV to MeV. For carbon ions of energy in the keV range, it has been found that for each successive step (i), doses of no more than $3 \times 10^{15}$ cm$^2$ achieve the desired damage without causing amorphisation. With such dose steps, a total carbon ion dose of $20 \times 10^{15}$ cm$^{-2}$ or higher can be implanted without the diamond being damaged to the point that it becomes amorphous. Using a single step process diamond has been found to be irreversibly damaged, i.e. rendered amorphous, at a carbon ion dose of $5,5 \times 10^{15}$ cm$^{-2}$.

Boron—The doses which can be used when implanting boron are similar to those suitable for implanting carbon ions, except slightly higher doses can be tolerated. Doses of $3 \times 10^{15}$ cm$^{-2}$ have been found to be useful for ion energies in the keV range.

Nitrogen—Again, similar doses to those used for implanting carbon ions can be used, except with nitrogen being a slightly heavier atom, the doses for each implantation will be lower and typically of the order of $1 \times 10^{15}$ cm$^{-2}$.

Other dopant atoms such as arsenic and phosphorus may also be introduced into diamond using the method of the invention.

The dose in each successive implantation step can vary as can the annealing temperature in each subsequent rapid annealing step.

In each implantation step, it is possible to use ions of different energies. This will have the effect of producing a damaged layer of uniform nature from an outer surface of the diamond to the depth of the damage. If ions of one energy only are used, a damaged layer lying wholly within the diamond and not being bounded on one side by an outer surface of the diamond can result for high enough energies.

The thickness or depth of the damaged layer will depend on various factors such as the nature of the ion which is used to damage the diamond and the energy of that ion. The layer may vary in thickness from fractions of a micron to a few microns or more.

In step (iii), the product of step (ii) is annealed to reduce lattice damage and cause dopant interstitial atoms to diffuse into lattice positions. The annealing is rapid in the sense that the annealing temperature is reached in a short space of time. How rapid the annealing temperature is reached will be dependent on factors such as the annealing temperature selected and the thickness of the damaged layer. Preferably, the annealing is such that at the temperature selected, the temperature will be reached before the average time it takes for an interstitial to move out of the damaged layer. The annealing temperature will typically be in the range 500° C. to 1500° C.. Annealing will take place in an atmosphere which inhibits graphitisation of the diamond. Examples of such atmospheres are reducing atmospheres, inert, e.g. argon, atmospheres and vacuums. For temperatures in the lower region of this range, i.e. not exceeding 1000° C., the heating time to reach the annealing temperature in each step (iii) will generally be from a few seconds to 20 seconds. For temperatures at the higher end of the range, i.e. above 1000° C., the heating time to reach the annealing temperature in each step (iii) will generally be less than one second. The total annealing time, once the annealing temperature has been reached for each step (iii), will typically not exceed 30 minutes for each step.

The efficiency of the method of the invention has been established experimentally. In these experiments, rectangular, high purity, type IIa diamond blocks were used. Although their thicknesses varied between 2,5 and 0,8 mm, they all had faces of 8 by 3,7 mm. Implantations, at liquid nitrogen target temperatures, were done through graphite masks defining an implantation area of 7×3 mm on each diamond. Before mounting them for the first implantation step, each diamond was carefully polished to present a virgin surface. This was followed by boiling for 60 minutes in a simmering solution of sulphuric, nitric and perchloric acids, and rinsing in distilled water. Before each subsequent implantation step, the latter cleaning procedure was repeated. After implantation in a Varian/Extrion model 200-20A2F ion implanter, the end station holder was removed and placed into a bath containing liquid nitrogen. The diamonds were then dismounted under liquid nitrogen and transferred to another, shallower, dewar of liquid nitrogen.

After preheating a graphite crucible to the required temperature with the aid of an P,F-coil, the diamond target was extracted from the Dewar with a pair of tweezers and launched, implanted face down, along a chute into the crucible. In this way rapid heating was obtained to the selected temperature and maintained for the preselected time duration. The crucible was continually flushed with ultra-high pressure argon throughout the anneal. After annealing, each diamond was again cleaned by boiling in acids and rinsing in distilled water.

Resistance measurements were made in a specially designed and built furnace. The furnace itself formed a Faraday cage with evacuating holes and feedthroughs through its lid. After contact preparation, the diamond could be stably mounted inside the furnace between two rigid clamps which also served as contacts. The temperature was monitored by a chromel-alumel thermocouple, with its point embedded into a small type IIa diamond, which was mounted between the unimplanted diamond face and the bottom of one of the clamps. In turn, the whole furnace was placed in a bell jar with suitable feedthroughs mounted into the bottom plate on which it rested. It was then evacuated using a rotary pump with a zeolite filter to limit oil backstreaming. Current-voltage, and thus resistance, measurements were made using a Keithley model 617 programmable electrometer. The electrometer, thermocouple, and furnace heating control were all interfaced with an IBM-compatible personal computer to allow for automated data collection.

Layers were generated by either implanting only carbon atoms or only boron ions. For each implantation step, the ions were implanted at different energies in order to obtain a mix of implanted atoms and radiation damage. The energies and doses used for a carbon ion implantation step of $1 \times 10^{15}$ cm$^{-2}$, are shown in Table I. These parameters were chosen to give, according to a TRIM89 [J. F. Ziegler, J. P. Biersack and U. Littmark, in: The Stopping and Range of Ions in Solids, (Pergamon Press, New York, 1985)] simulation, the same damage distribution as was generated for the implantations shown in Table I. Assuming a displacement energy of 55 eV, the average number of vacancies produced per ion came to 138 for the carbon implantation.

TABLE I

Ion energies and doses which were used to create a carbon ion implanted layer to a total dose of $1.0 \times 10^{15}$ cm$^{-2}$.

| ION | ENERGY (keV) | DOSE (cm$^{-2}$) | VACANCIES (cm$^{-2}$) |
|---|---|---|---|
| CARBON | 150 | $4.0 \times 10^{14}$ | $6.19 \times 10^{16}$ |
|  | 120 | $2.6 \times 10^{14}$ | $3.77 \times 10^{16}$ |
|  | 80 | $2.2 \times 10^{14}$ | $2.66 \times 10^{16}$ |
|  | 50 | $1.2 \times 10^{14}$ | $1.18 \times 10^{16}$ |
| TOTALS: |  | $1.0 \times 10^{15}$ | $1.38 \times 10^{17}$ |

The advantages of using multiple low dose ion implantations in contrast to larger dose implantations can be seen clearly from the graph of FIG. 1. This is a graph of sheet resistance against cumulative ion dose for the carbon ion implanted diamond. The plot of the squares (□) is a plot of multiple low dose ion implantations, each implantation being followed by a rapid anneal to 650° C. This annealing temperature was reached in less than 10 seconds and maintained at this temperature for 30 minutes for each annealing step. The dose of each ion implantation step was $1 \times 10^{15}$ cm$^{-2}$. There were 20 steps in all. It will be noted that the sheet resistance dropped only slightly indicating that the diamond structure and lattice remained intact, notwithstanding the ion implantation annealing sequences. This is to be contrasted with large dose ion implantations which follow the plot of the triangles (▽). The dose for each ion implantation in this instance was $4 \times 10^{15}$ cm$^{-2}$. It will be noted that at a cumulative dose of between 8 and $12 \times 10^{15}$ cm$^{-2}$, there was a very, sharp drop in the sheet resistance accompanied by a blackening of the implanted layer indicating substantial amorphisation of the diamond leading to graphite formation on annealing.

Figure 2:
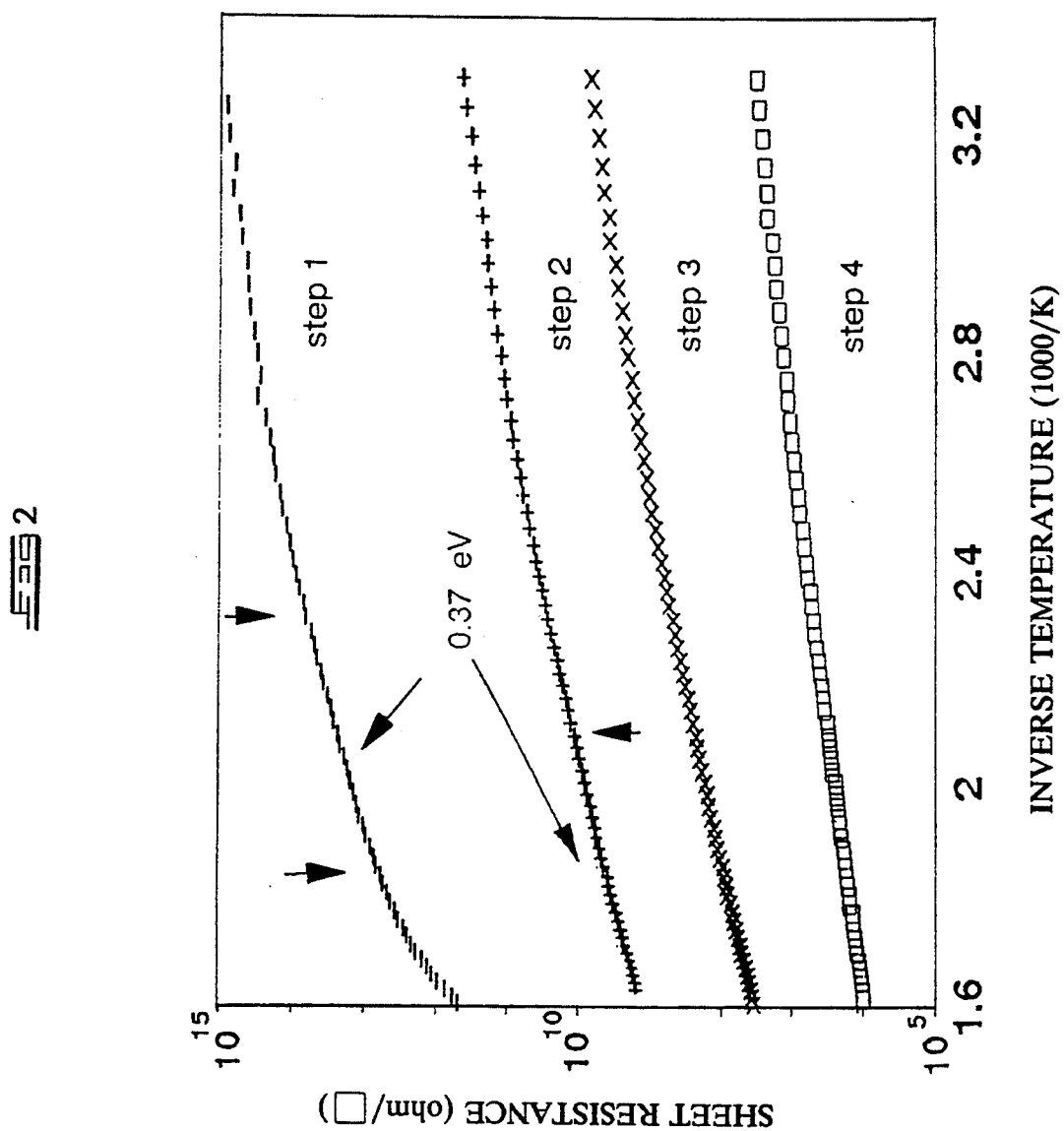

In order to test whether the density of uncompensated acceptors can be continually increased, at this annealing temperature, by means of the method of the invention, implantations were done on a diamond as described above using boron dose steps of $3 \times 10^{15}$ cm$^{-2}$, also spread over different energies, to obtain a damaged layer of similar dimensions to the carbon damaged layer. Each implantation step was followed by rapid temperature annealing to 1200° C. lasting for 5 minutes. The annealing temperature was reached in less than one second. After each annealing step, the resistance was measured as a function of temperature, and the results for the first four steps are shown in FIG. 2. The drop in resistance after each cold implantation/rapid annealing step is dramatic and is attributable only to the increase of boron dopant concentration in the diamond. From the first to the second step the resistance, at room temperature, dropped by more than three orders of magnitude, and the region showing an activation energy of $\approx 0.37$ eV moved towards higher temperatures. Further drops in resistance by factors of 1,8 and 2,4 were recorded for the third and fourth steps. Plotting the resistance curves as functions of $T^{\frac{1}{4}}$ rendered straight lines for the data after the latter steps, thus indicating variable range hopping conduction. Notwithstanding these extremely high doping levels achieved, the colour of the diamond changed very little. In fact the transparency seemed rather to improve when compared with a similar unimplanted type IIa diamond. The transparency of the diamond is indicative of the diamond remaining quality type IIa diamond.

What is claimed is:

1. A method of producing a doped diamond comprising the steps of:
   (i) creating a damaged layer of point defects in the form of vacancies and interstitial atoms within the crystal lattice of a diamond using low dose ion implantation at low temperature;
   (ii) introducing dopant atoms into the damaged layer using low dose ion implantation at low temperature;
   (iii) rapidly annealing the product of step (ii) to reduce lattice damage and to cause dopant interstitial atoms to diffuse into lattice positions; and
   (iv) repeating steps (i) to (iii) within the same layer until a doped diamond having a desired amount of dopant is produced wherein the amount of dopant is greater than could be achieved with a single doping without causing amorphisation of the diamond.

2. A method according to claim 1 wherein the ions used to create the damaged layer in step (i) are carbon ions.

3. A method according to claim I wherein the dopant atoms are selected from nitrogen, boron, arsenic and phosphorus.

4. A method according to claim 1 wherein the same ions are used for ion implantation steps (i) and (ii).

5. A method according to claim 4 wherein the dopant atoms are boron atoms.

6. A method according to claim i wherein the steps (i) to (iii) are repeated at least five times.

7. A method according to claim 1 wherein the ion implantation of steps (,i) and (ii) is carried out at a temperature of below 0° C.

8. A method according to claim I wherein the ion implantation of steps (i) and (ii) is carried out at a temperature of liquid nitrogen or lower.

9. A method according to claim 1 wherein the annealing temperature of the rapid annealing of step (iii) is in the range 500° C. to 1500° C.

10. A method according to claim 9 wherein the annealing temperature does not exceed 1000° C. and this temperature is reached in less than 20 seconds.

11. A method according to claim 9 wherein the annealing temperature is above 1000° C. and this temperature is reached in less than one second.

12. A method according to claim 1 wherein the total annealing time, once the annealing temperature has been reached, for each step (iii) does not exceed 30 minutes.

13. A method according to claim 1 wherein in each ion implantation step a range of ion energies is used.

* * * * *

UNITED STATES PATENT AND TRADEMARK OFFICE
CERTIFICATE OF CORRECTION

PATENT NO. : 5,385,762
DATED : January 31, 1995
INVENTOR(S) : Prins

It is certified that error appears in the above-indentified patent and that said Letters Patent is hereby corrected as shown below:

Column 2, line 22, please delete "$cm^2$" and insert therefor -- $cm^{-2}$ --.

Column 3, line 17, please delete "hits" and insert therefor -- has --.

Column 3, line 39, please delete "P,F-coil," and insert therefor -- RF-coil, --.

Column 5, line 2, please delete "$T^{1/4}$" and insert therefor -- $T^{-1/4}$ --.

Column 6, line 11, please delete "claim i" and insert therefor -- claim 1 --.

Column 6, line 14, please delete "steps (,i)" and insert therefor -- steps (i) --.

Column 6, line 16, please delete "claim I" and insert therefor -- claim 1 --.

Signed and Sealed this

Eleventh Day of April, 1995

*Attest:*

BRUCE LEHMAN

*Attesting Officer*  *Commissioner of Patents and Trademarks*